United States Patent [19]
Aomori et al.

[11] Patent Number: 5,504,020
[45] Date of Patent: Apr. 2, 1996

[54] METHOD FOR FABRICATING THIN FILM TRANSISTOR

[75] Inventors: Shigeru Aomori; Atsushi Yoshinouchi; Keiji Tarui; Tatsuo Morita, all of Tenri, Japan

[73] Assignee: Sharp Kabushiki Kaisha, Osaka, Japan

[21] Appl. No.: 307,068

[22] Filed: Sep. 16, 1994

[30] Foreign Application Priority Data

Sep. 22, 1993 [JP] Japan .................................. 5-236610
Jul. 28, 1994 [JP] Japan .................................. 6-177076

[51] Int. Cl.$^6$ .................. H01L 21/265; H01L 29/786
[52] U.S. Cl. .................. 437/40; 437/24; 437/933; 437/937; 437/41
[58] Field of Search .................. 437/24, 937, 913, 437/933, 40, 28, 29, 41, 45, 911

[56] References Cited

U.S. PATENT DOCUMENTS 5,397,718  3/1995  Furuta et al. .................. 437/913
5,403,756  4/1995  Yoshinouchi et al. .................. 437/933

FOREIGN PATENT DOCUMENTS 61-22669   1/1986  Japan .
63-119270  5/1988  Japan .
4-39967    2/1992  Japan .
6-104280   4/1994  Japan .

*Primary Examiner*—Tuan H. Nguyen
*Attorney, Agent, or Firm*—Nixon & Vanderhye

[57] ABSTRACT

A method for fabricating a thin film transistor includes the steps of: forming a semiconductor layer and a gate electrode on an insulating substrate with a gate insulating film interposed therebetween; and implanting an impurity element into a surface of the semiconductor layer by accelerating hydrogen ions and ions of an element of the group III or the group V of the periodic table using at least one of the gate electrode and a resist mask used for forming the gate electrode as a mask, so as to perform both formation of source and drain regions and hydrogenation of a channel region, wherein the concentration of hydrogen ions in the channel region of the semiconductor layer is regulated in the range of $1 \times 10^{19}$ ions/cm$^3$ to $1 \times 10^{20}$ ions/cm$^3$.

12 Claims, 8 Drawing Sheets

METHOD FOR FABRICATING THIN FILM TRANSISTOR

BACKGROUND OF THE INVENTION

1. Field of the Invention

The present invention relates to a method for fabricating a thin film transistor used in a liquid crystal display or the like.

2. Description of the Related Art

FIG. 7 is a plan view of a conventional thin film transistor (hereinafter referred to as a TFT) having a staggered structure.

In FIG. 7, on the surface of an insulating substrate 51, a semiconductor layer 52 which is described below is formed. A gate insulating film (not shown) is formed so as to cover the surface of the semiconductor layer 52. The gate insulating film insulates a gate electrode 53 which will be formed in a later step from the semiconductor layer 52. On the surface of the gate insulating film, the gate electrode 53 is formed so as to cross the center portion of the semiconductor layer 52. A portion of the semiconductor layer 52 directly under the gate electrode 53 serves as a semiconductor-layer channel region 52c. One of the portions of the semiconductor layer 52 which are separated by the channel region 52c serves as a semiconductor-layer source 52a and the other portion serves as a semiconductor-layer drain 52b. At positions corresponding to the semiconductor-layer source 52a and the semiconductor-layer drain 52b, contact holes 56 and 57 for the connection to a source electrode 54 and a drain electrode 55 are formed in the gate insulating film, respectively. At a position in the gate electrode 53 opposite to the crossing portion in which the gate electrode 53 and the semiconductor layer 52 are crossed, a contact hole 59 for connecting the gate electrode 53 to a gate bus line 58 is formed. A TFT having the above-described structure is fabricated by the following method. The fabrication method will be schematically described with reference to FIGS. 8A through 8C.

First, as shown in FIG. 8A, a semiconductor layer 52 is formed on a transparent insulating substrate 51. Then, so as to cover the semiconductor layer 52, a gate insulating film (not shown) is formed.

Next, as shown in FIG. 8B, a gate electrode 53 is formed by patterning on the surface of the gate insulating film so as to cross the semiconductor layer 52.

Next, using the gate electrode 53 as a mask, an impurity element 60 is implanted from the gate insulating film side into the semiconductor layer 52 in a self-aligned manner, so as to form a semiconductor-layer source 52a and a semiconductor-layer drain 52b.

Next, an interlayer insulating film (not shown) is formed so as to cover the semiconductor layer 52 and the gate electrode 53.

Thereafter, as shown in FIG. 8C, a contact hole 61 for the connection to a source bus line or a source electrode (both not shown) is formed in the interlayer insulating film at a position corresponding to the semiconductor-layer source 52a. A contact hole 62 for the connection to a drain electrode (not shown) is formed in the interlayer insulating film at a position corresponding to the semiconductor-layer drain 52b. At the same time, a contact hole 63 for connecting the gate electrode 53 to a gate bus line (not shown) is formed in the interlayer insulating film at a position corresponding to the end portion of the gate electrode 53 on the opposite side to the crossing portion in which the gate electrode 53 and the semiconductor layer 52 are crossed.

Finally, a conductive material such as a metal is deposited on the interlayer insulating film and on the semiconductor-layer source 52a, the semiconductor-layer drain 52b, and the gate electrode 53 via the respective contact holes 61, 62, and 63. As a result, the contact holes 61, 62, and 63 are filled with the conductive material. Then, various bus lines and electrodes are formed by patterning.

When such a staggered type polycrystalline silicon TFT is to be fabricated, in order to attain good transistor characteristics, the semiconductor-layer source and drain regions are formed by introducing an impurity element into the semiconductor layer in a self-aligned manner as described above.

The impurities can be introduced by thermal diffusion or ion implantation. By using thermal diffusion, the impurities are introduced from the surface of the semiconductor layer. By using ion implantation, impurity ions are implanted into the semiconductor layer. The ion implantation method provides a more precise control of total dopant concentration and a depth to which the impurities are implanted into the semiconductor layer. Moreover, when the ion implantation technique is used, impurities can be shallowly implanted into the semiconductor layer, and impurities can be implanted into a thin film. Furthermore, ion implantation can be performed at low temperatures, so that a TFT can be formed on a glass substrate which is inexpensive and easily made in a larger size. For the above reasons, ion implantation is most often used for introducing impurities into a semiconductor layer in the fabrication process of a TFT.

In the above-described fabrication process of the TFT, impurities are implanted using an ion beam having a diameter of only several millimeters by a conventional ion implantation apparatus. When the ions are to be implanted over a large substrate using the above conventional ion implantation apparatus, it is necessary to either move the substrate mechanically or scan the ion beam electrically over the substrate because the area of the substrate is large as compared to the diameter of the ion beam. The provision of a mechanical moving means for the substrate or an electrical scanning means for the ion beam causes a problem in that the ion implantation apparatus becomes complicated, large-sized and expensive.

One technique for solving the above problem and in which ions can be easily implanted into a large area is an ion shower doping method. According to this technique, ions generated by using a plasma discharge as the ion source are accelerated at a low voltage without mass separating them, and are implanted into a substrate which has been heated to a predetermined temperature in a shower-like shape. In the ion implantation in a shower-like shape, ions are implanted over the semiconductor layer at a time.

When a glass substrate which is inexpensive and is easy to make in a larger size is used as a transparent insulating substrate which is usually used in an image sensor or a liquid crystal display, it is preferable to set the temperature in the heating process at a temperature of 600° C. or lower. At a temperature of 600° C. or lower, however, it takes about 20 hours or more to perform the annealing for activation after the ion implantation by the ion shower doping, which causes a problem in that the fabrication process is very time consuming.

As a liquid crystal substrate becomes larger, it is necessary to lower the resistance of the gate electrode of the TFT and the gate bus line. In general, polycrystalline silicon or polycrystalline silicon into which impurities have been doped is used for the gate of the self-aligned type polycrystalline silicon TFT. If such a material is used for the gate bus line, the resistance of the material is too high. Therefore, the use of low-resistance metal material such as aluminum is considered as the gate electrode wiring material.

However, such a low-resistance metal material has a low melting point. Accordingly, when the material is exposed at a temperature of 450° C. or higher, there arise problems of roughness of the metal-film surface, occurrence of protrusions, peeling-off of the metal film, and the like. Thus, the metal film could not resist the activation at 600° C., so that it cannot be used in the TFT in which the impurity implantation is performed in a self-aligned manner.

Against the above-mentioned problems, a method which does not necessitate the activating annealing is disclosed in Japanese Patent Application No. 03-304573. According to this method, the hydrogen ion concentration in a material gas used as the plasma source in the ion shower doping is set to be 80% or more. With the assist of the high-concentration hydrogen ions, the impurity ions are self-activated in the polycrystalline silicon thin film during the ion implantation. Accordingly, the annealing step after the ion implantation is not required, and it is possible to use the low-resistance metal material as the gate electrode interconnection material.

However, the above-described conventional ion shower doping technique involves the following problems.

According to the ion shower doping method utilizing self-activation, it is necessary to implant a large amount of hydrogen ions. In such a case, excessive hydrogen ions may also be implanted into the semiconductor-layer channel region directly under the gate electrode, and hence the transistor characteristics of the TFT are deteriorated due to the influence of the hydrogen ions.

In the polycrystalline silicon TFT formed by the conventional ion shower doping method, it is necessary to terminate crystal defects or the like existing in the channel region by implanting an appropriate amount of hydrogen atoms, in order to stabilize the transistor characteristics of the TFT.

SUMMARY OF THE INVENTION

The method for fabricating a thin film transistor of this invention includes the steps of: forming a semiconductor layer and a gate electrode on an insulating substrate with a gate insulating film interposed therebetween; and implanting an impurity element into a surface of the semiconductor layer by accelerating hydrogen ions and ions of an element of one of the group III and the group V of the periodic table using at least one of the gate electrode and a resist mask used for forming the gate electrode as a mask, so as to perform both formation of source and drain regions and hydrogenation of a channel region, wherein the concentration of hydrogen ions in the channel region of the semiconductor layer is regulated in the range of $1 \times 10^{19}$ ions/cm$^3$ to $1 \times 10^{20}$ ions/cm$^3$.

According to another aspect of the invention, the method for fabricating a thin film transistor includes the steps of: forming a semiconductor layer on an insulating substrate; forming a gate insulating film on the semiconductor layer; forming a gate electrode on the gate insulating film; and implanting an impurity element into the semiconductor layer by accelerating hydrogen ions and ions of an element of one of the group III and the group V of the periodic table using the gate electrode as a mask, so as to perform both formation of source and drain regions and hydrogenation of a channel region, wherein the concentration of hydrogen ions in the channel region is regulated in the range of $1 \times 10^{19}$ ions/cm$^3$ to $1 \times 10^{20}$ ions/cm$^3$.

According to another aspect of the invention, the method for fabricating a thin film transistor includes the steps of: forming a semiconductor layer on an insulating substrate; forming a gate insulating film on the semiconductor layer; forming a conductive thin film on the gate insulating film; forming a resist pattern having a predetermined pattern on the conductive thin film; forming a gate electrode and a gate electrode interconnection from the conductive thin film using the resist pattern as a mask; and implanting an impurity element into the semiconductor layer by accelerating hydrogen ions and ions of an element of one of the group III and the group V of the periodic table using the resist pattern and the gate electrode as a mask, so as to perform both formation of source and drain regions and hydrogenation of a channel region, wherein the concentration of hydrogen ions in the channel region is regulated in the range of $1 \times 10^{19}$ ions/cm$^3$ to $1 \times 10^{20}$ ions/cm$^3$.

In one embodiment of the invention, the semiconductor layer is made of polycrystalline silicon.

In another embodiment of the invention, the gate electrode is formed of a material selected from a group at least including aluminum, a metal containing aluminum, and a layered structure of aluminum and a metal other than aluminum.

In another embodiment of the invention, steps after the step of implanting the impurity element are performed at temperatures of 450° C. or less.

In the method for fabricating a TFT according to the invention, by the function of the film thickness of the gate electrode or the film thickness of the resist mask used for forming the gate electrode, the hydrogen ion concentration implanted into the channel region is regulated in the range of $1 \times 10^{19}$ ions/cm$^3$ to $1 \times 10^{20}$ ions/cm$^3$. Thus, the deterioration of the transistor characteristics of the TFT due to the influence by hydrogen ions is suppressed. Therefore, it is possible to utilize the ion shower doping without requiring an annealing step with high reliability.

Accordingly, it is possible to fabricate the TFT at a low temperature, so that the gate electrode can be formed of a material selected from a group at least including aluminum, a metal containing aluminum, and a layered structure of aluminum and a metal other than aluminum. In the case where the gate bus line is formed of a material selected from a group at least including aluminum, a metal containing aluminum, and a layered structure of aluminum and a metal other than aluminum for the purpose of lowering the resistance of the line, the gate electrode and the gate bus line are formed integrally in a single step.

In addition, the resist pattern used for forming the gate electrode of the TFT is used as a mask for impurity implantation, so that the photolithography process for forming a mask can be omitted. This mask can also protect the gate electrode from the impurity elements and hydrogen.

Thus, the invention described herein makes possible the advantage of providing a method for fabricating a TFT in which excess hydrogen is prevented from being implanted into the semiconductor-layer channel region of the TFT during the fabrication process of the TFT, and the implanted amount of hydrogen is limited so as to compensate for the channel-region crystal defects, whereby a TFT with high reliability can be efficiently fabricated.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. It is appreciated that the present invention is not limited by the specific examples described below.

Figure 1:
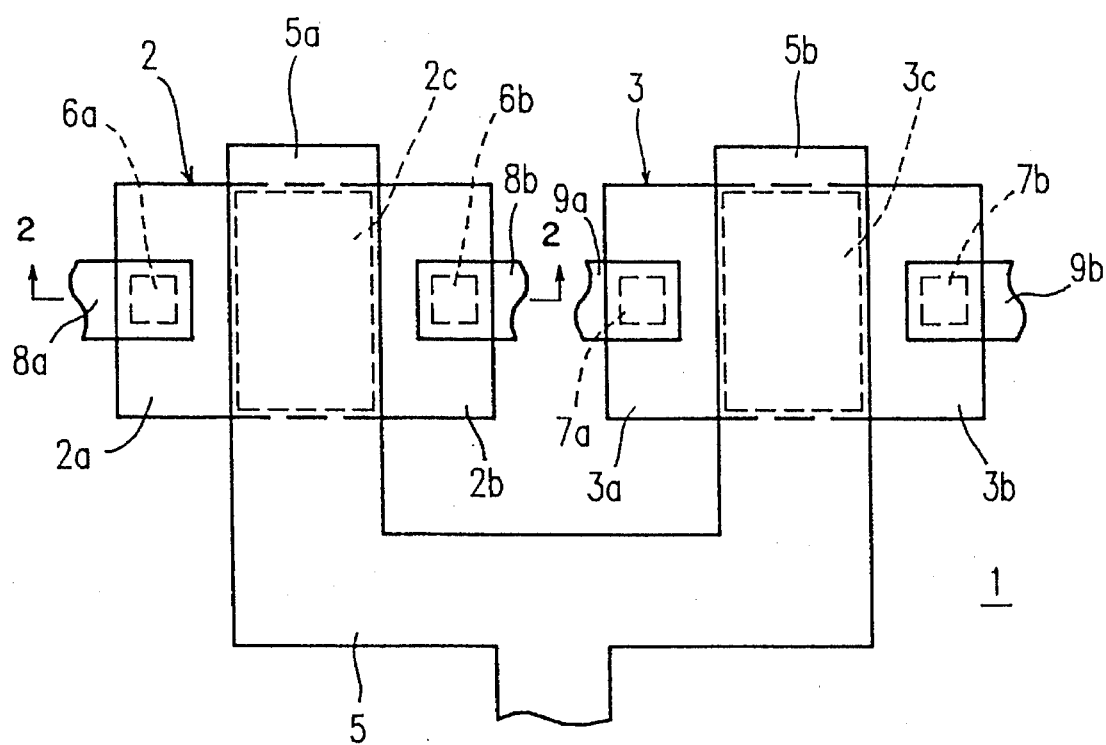
FIG. 1 is a plan view of a TFT having a CMOS structure in one example of the invention.
Figure 2:
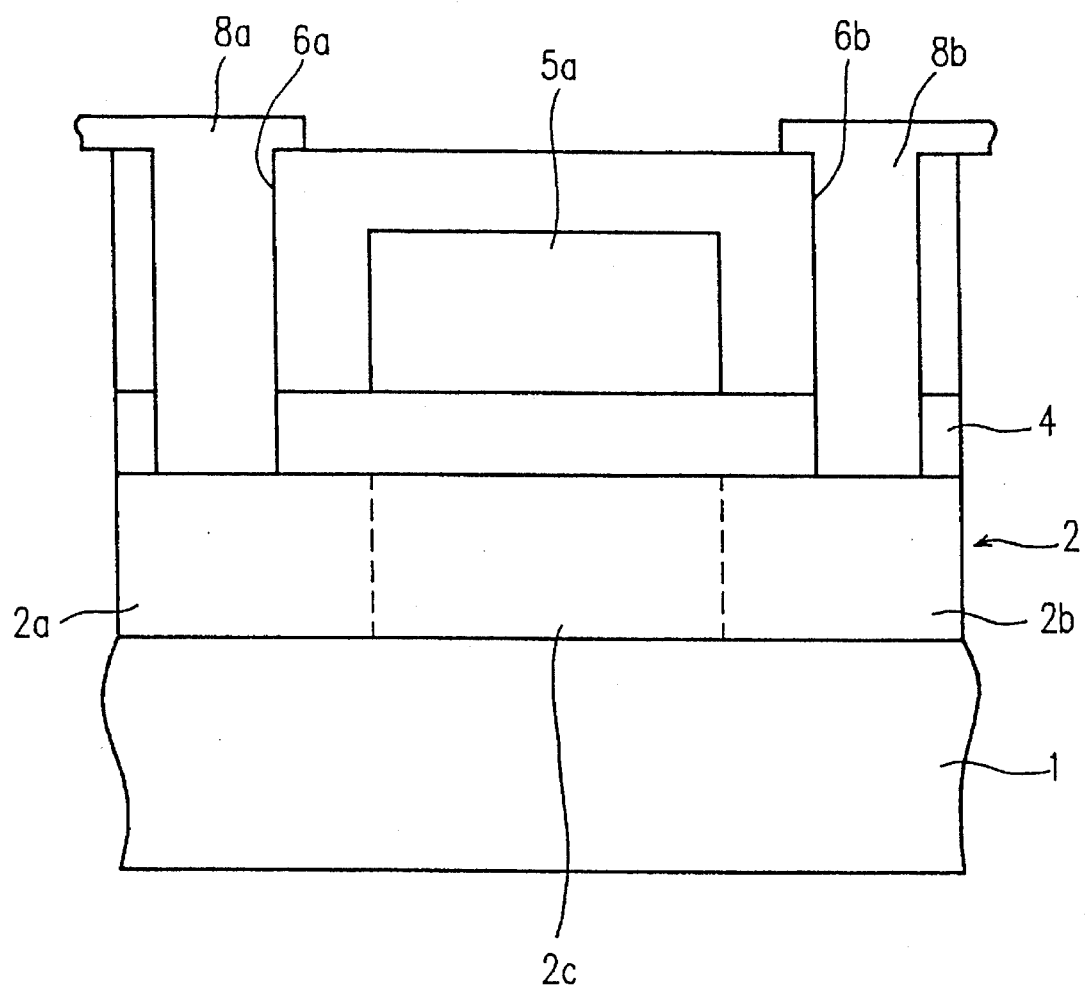
FIG. 2 is a cross-sectional view of the TFT taken along a line A—A' in FIG. 1.

FIG. 1 is a plan view of TFTs having a CMOS structure in one example of the invention. FIG. 2 is a cross-sectional view of the TFT taken along a line A—A' in FIG. 1. In FIGS. 1 and 2, two semiconductor layers 2 and 3 are formed on the surface of a transparent insulating substrate 1 made of, for example, glass or the like. A gate insulating film 4 made of $SiO_2$ (silicon oxide) is formed so as to cover the semiconductor layers 2 and 3. On the gate insulating film 4, a "]"-shaped gate electrode interconnection 5 is formed so as to cross the surface of each of central portions of the semiconductor layers 2 and 3. In end portions of the gate electrode interconnection 5, gate electrodes 5a and 5b are formed, respectively. Side portions of the semiconductor layers 2 and 3 separated by the gate electrodes 5a and 5b are semiconductor-layer sources 2a and 3a and semiconductor-layer drains 2b and 3b, respectively, to which impurities are implanted. Portions of the semiconductor layers 2 and 3 directly under the gate electrodes 5a and 5b are semiconductor-layer channel regions 2c and 3c (hereinafter, referred to as channel regions 2c and 3c). The hydrogen ion concentration of the channel regions 2c and 3c is in the range of $1\times10^{19}$ ions/cm$^3$ to $1\times10^{20}$ ions/cm$^3$. At the positions corresponding to the semiconductor-layer source 2a and the semiconductor-layer drain 2b, contact holes 6a and 6b are formed through the gate insulating film 4 so as to reach the surface of the semiconductor-layer source 2a and the semiconductor-layer drain 2b. Similarly, at the positions corresponding to the semiconductor-layer source 3a and the semiconductor-layer drain 3b, contact holes 7a and 7b are formed through the gate insulating film 4 so as to reach the surface of the semiconductor-layer source 3a and the semiconductor-layer drain 3b. A source electrode 8a is formed so as to be connected to the semiconductor-layer source 2a via the contact hole 6a, and a drain electrode 8b is formed so as to be connected to the semiconductor-layer drain 2b via the contact hole 6b. A source electrode 9a is formed so as to be connected to the semiconductor-layer source 3a via the contact hole 7a, and a drain electrode 9b is formed so as to be connected to the semiconductor-layer drain 3b via the contact hole 7b. As a result, a TFT having a staggered structure is constructed.

As described above, in the TFT of this invention, a semiconductor layer and a gate electrode are disposed with a gate insulating film interposed therebetween on an insulating substrate, and the semiconductor layer includes a source region and a drain region formed therein and a channel region in a portion of the semiconductor layer in which the semiconductor layer and the gate electrode are crossed via the gate insulating film. In the TFT having the above-described construction, the hydrogen ion concentration in the channel region is regulated so as to be in the range of $1\times10^{19}$ ions/cm$^3$ to $1\times10^{20}$ ions/cm$^3$ by the film thickness of the gate electrode and the film thickness of the resist mask used for forming the gate electrode.

By regulating the hydrogen ion concentration in the channel regions 2c and 3c so as to be in the range of $1\times10^{19}$ ions/cm$^3$ to $1\times10^{20}$ ions/cm$^3$ as described above, the deterioration of the transistor characteristics of the TFT due to the existence of hydrogen ions can be reduced, and the ion shower doping method without requiring the annealing step can be utilized with high reliability.

The case where the TFT of this example is produced by using the ion shower doping method will be described below.

Figure 3:
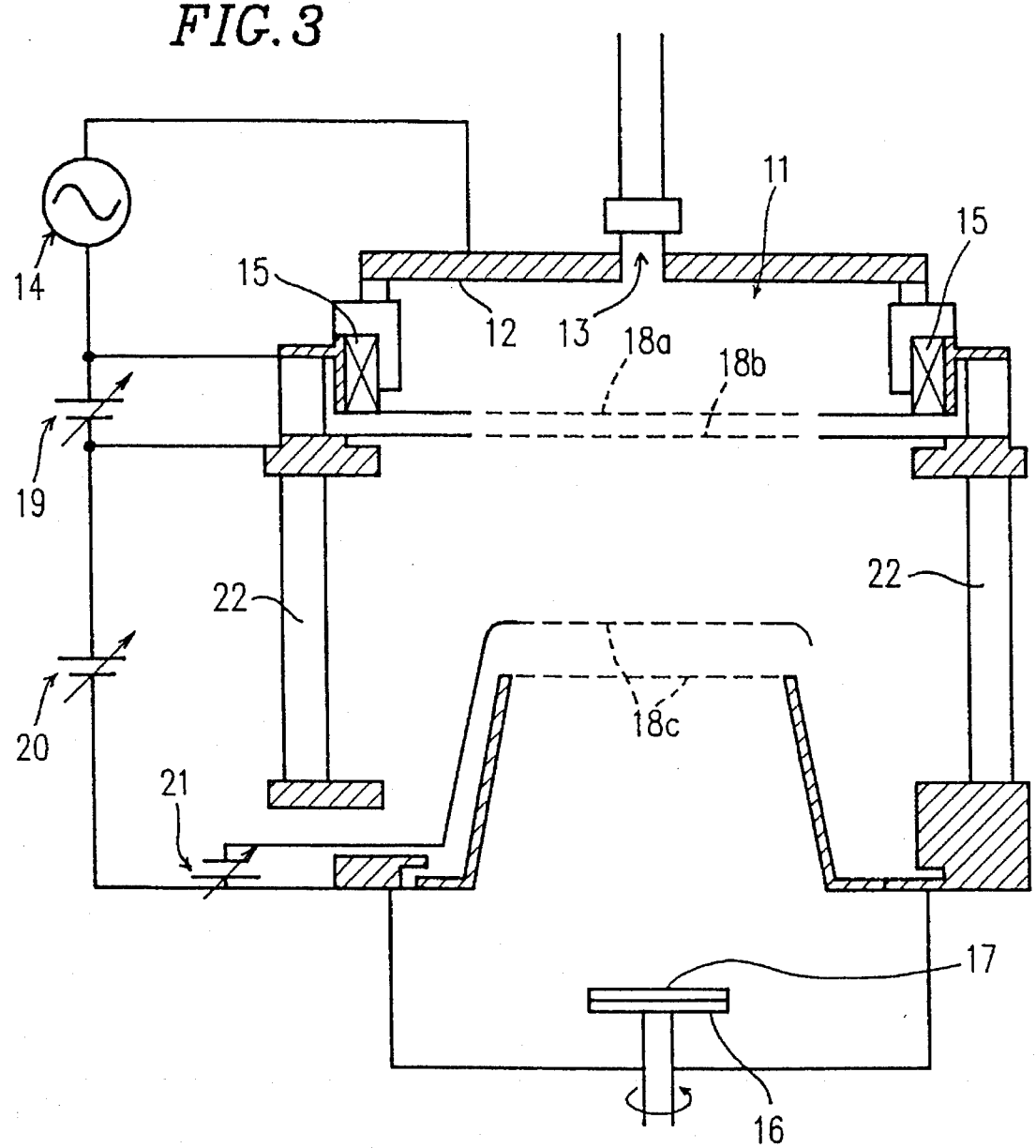
FIG. 3 is a schematic cross-sectional view of an ion shower doping apparatus used for implanting impurities into the TFT shown in FIG. 1.

FIG. 3 shows a schematic cross-sectional view of an ion shower doping apparatus used in this example. In the ion shower doping apparatus shown in FIG. 3, a high frequency electrode 12 is provided above a chamber 11 which constitutes a plasma chamber for forming a plasma as an ion source, and a gas inlet 13 is provided in the center of the high frequency electrode 12. A high frequency power supply 14 for exciting a plasma is connected to the high frequency electrodes 12. The high frequency electric power is supplied from the high frequency power supply 14 to the plasma source via the high frequency electrode 12. A magnet 15 is provided on the upper portion of the side wall of the chamber 11 so as to aid effective generation of ions and to adjust the shape of the plasma. The chamber 11, the high frequency electrode 12, the gas inlet 13, the high frequency power supply 14 and the magnet 15 constitute a plasma generating section.

A substrate holder 16 which can rotate is provided at a position separated from the gas inlet 13 by a predetermined distance so as to face the gas inlet 13. A substrate 17 into which ions are to be implanted is mounted on the substrate holder 16. The substrate holder 16 has a rotating mechanism for improving the uniformity of ion implantation into the substrate 17.

Mesh-type electrode plates 18a, 18b, and 18c are provided at predetermined intervals between the gas inlet 13 and the substrate 17 mounted on the substrate holder 16. To the electrode plate 18a, a first ion acceleration power supply 19 is connected for deriving ions from the plasma source and accelerating the ions. To the electrode plate 18b, a second ion acceleration power supply 20 is connected to further accelerating the derived ions. To the electrode plate 18c, a deceleration power supply 21 for controlling secondary electrons is connected. So as to cover the mesh-like electrode plates 18a, 18b, and 18c, an insulator 22 for insulating the electrode plates 18a, 18b, and 18c from each other is provided. In this way, the ion accelerating section is constituted.

By the above-described construction, through the gas inlet 13, a material gas, e.g., a mixed gas, including an element of the group V of the periodic table and hydrogen such as $PH_3$ is introduced for the ion shower doping. Then, a high frequency electric power is applied on the high frequency electrode 12, so as to form an excited plasma source. After the ions are accelerated between the acceleration electrode plates 18a and 18b, the ions are implanted into the substrate 17 which is mounted on the substrate holder 16. At this time, the hydrogen ion concentration which is implanted into the channel region of the substrate 17 is regulated by the film thickness of the gate electrode or the film thickness of the resist mask used for forming the gate electrode. Therefore, the ion implantation into the substrate 17 having a large area can be performed without mechanically operating the substrate 17 or electrically scanning the ion beam.

In this example, a plasma source including an element of the group V of the periodic table and hydrogen is used. Alternatively, ions from a plasma source including an element of the group III of the periodic table and hydrogen may be accelerated and the ions may be implanted into a semiconductor film of the substrate 17.

In this example, the above-described ion shower doping apparatus is used, and the hydrogen ion concentration of the material gas of the plasma source in the ion shower doping is set to be 80% or more. With the assist of the high concentration of the hydrogen ions, the impurity element is self-activated in the ion implantation, without annealing for activation in the polycrystalline silicon thin film, so as to form the source and drain regions of a TFT.

In addition, in this invention, by using the ion shower doping method, the concentration of hydrogen ions implanted into the channel region of the TFT for forming the source and drain of the TFT is regulated in the range of $1 \times 10^{19}$ ions/cm$^3$ to $1 \times 10^{20}$ ions/cm$^3$.

Herein, the evaluation of the hydrogen ion concentration is conducted on the basis of the "LSS theory" (named after its developers, Lindhard, Scharff, and Schiott) which is the general theory related to the ion doping. According to the LSS theory, based on the statistic data, the concentration distribution of the ions implanted into a film is calculated. An exemplary calculation of the ion concentration in a film is shown below. Equation (1) below is the calculation for obtaining the ion concentration N(x) according to the LSS theory.

$$N(x)=[D/\{\sqrt{(2\pi)}\cdot \Delta Rp\}]\times exp[-(x-Rp)^2/2(\Delta Rp)^2] \quad (1)$$

where D: dose of ions,

Rp: depth of the position at which the ion concentration is the highest measured from the film surface, $\Delta Rp$: variance of ion implantation distribution, and x: depth to which the ion is implanted measured from the film surface.

Figure 4:
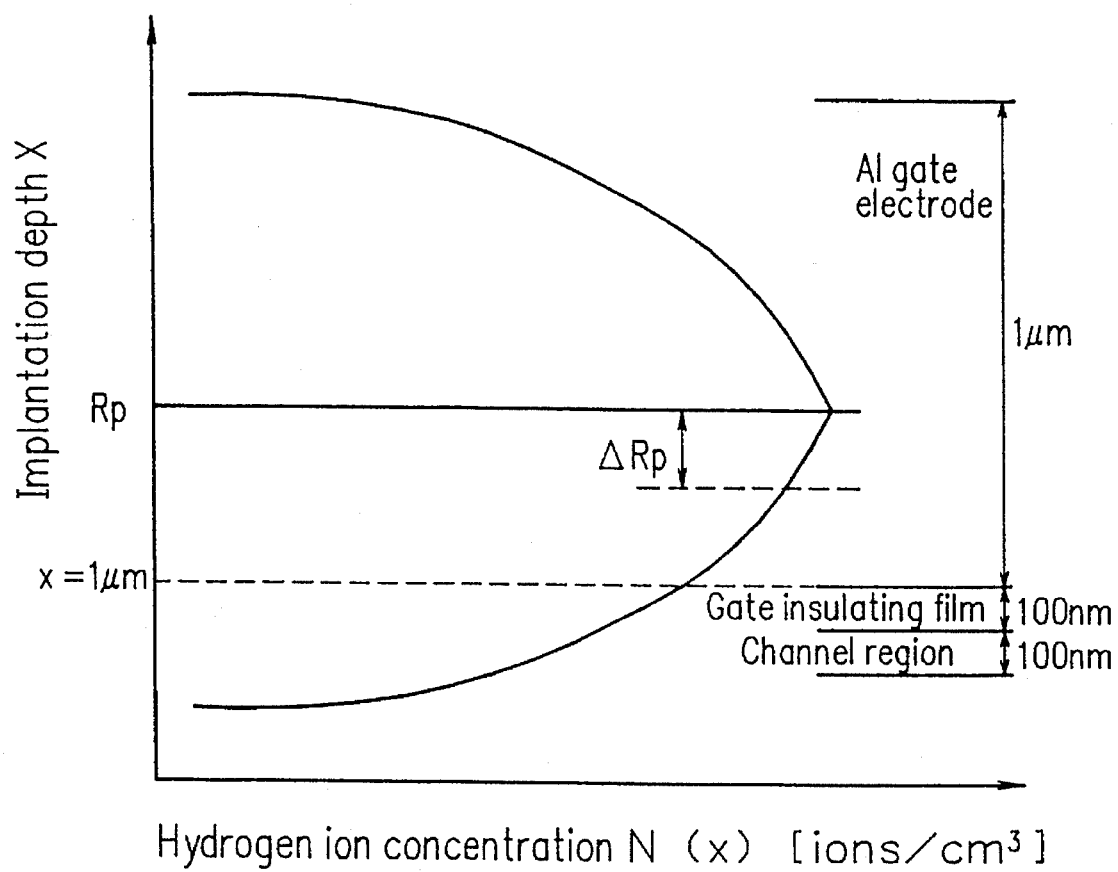
FIG. 4 is a diagram showing the concentration distribution of hydrogen ions implanted into a thin film along a depth direction, on the basis of the LSS theory.

For simplifying the explanation, as an example, a method for calculating the hydrogen ion concentration having an energy of 90 KeV will be described in the case where only a hydrogen gas is used as the material gas so that only hydrogen ions are implanted into an upper structure which is composed of three layers of an Al gate electrode, a gate insulating film, and a channel region and includes the channel region of a TFT as shown in FIG. 4.

For example, the implanting conditions for ion shower doping are set as follows:

Acceleration voltage: 90 KV
Total dose: $2 \times 10^{16}$ ions/cm$^2$

In this case, the hydrogen dose at an energy of 90 KeV of the coming hydrogen ions is 10% of the total dose based on the result of the ion analysis of the ion shower doping apparatus employed for the implantation. Specifically, the dose D of the hydrogen ions having an energy of 90 KeV in the hydrogen gas is $2 \times 10^{15}$ ions/cm$^2$.

Under the above-mentioned conditions, the profile of hydrogen ions along the depth direction of the Al thin film for the Al gate electrode in the upper layer of the channel region with the gate insulating film interposed therebetween is as shown in FIG. 4. The depth at the highest concentration of hydrogen ions Rp=756 nm, and the variance of implanted hydrogen distribution $\Delta Rp$=93 nm, on the basis of the statistic data of "LSS theory". The implanted hydrogen distribution varies depending on the material into which the ions are implanted.

Accordingly, in the structure of the channel region of the TFT as shown in FIG. 4, the hydrogen ion concentrations in the Al thin film used for the Al gate electrode are obtained as follows by evaluating Equation (1) with the above-mentioned conditions:

Hydrogen ion concentration at the implanted depth $$x=Rp: N(x)=9\times 10^{19} \text{ ions/cm}^3$$

Hydrogen ion concentration at the implanted depth $$x=1 \text{ }\mu m: N(x)=3\times 10^{18} \text{ ions/cm}^3$$

There are various energies of implanted hydrogen ions other than 90 KeV which is described above. Thus, the calculation is performed for each of the energies, so as to obtain hydrogen ion concentrations along the depth direction in the metal thin film for the Al gate electrode. In an example shown in FIG. 4, the right tail portion of the hydrogen ion concentration distribution in the film is shown as being equal to the depth at which the hydrogen ion concentration is to be obtained. Alternatively, by changing the condition related to the implantation energy, it is possible to regulate the concentration so that the point at the highest concentration Rp is positioned at the depth at which the hydrogen ion concentration is to be obtained.

The hydrogen ion concentration is the concentration in the channel region in the layer lower than the gate insulating film directly under the gate electrode. The material gas used for the fabrication of the TFT is a gas including hydrogen and an element of the group III (e.g., $B_2H_6$ gas) or a mixed gas including hydrogen and an element of the group V (e.g., $PH_3$). First, the hydrogen ion dose for each energy in each gas is obtained, and then the hydrogen ion concentration in the gate insulating film is obtained on the basis of Equation (1) of "LSS theory". Then, based on the hydrogen ion concentration in the gate insulating film, the hydrogen ion concentration in the channel region is obtained. In other words, the hydrogen ion concentration at the boundary portion between the gate electrode and the gate insulating film and the energy of the hydrogen ions at the position are obtained, and then based on the obtained concentration and the energy, the hydrogen ion concentration in the gate insulating film is obtained. In the same way, the hydrogen ion concentration at the boundary between the gate insulating film and the channel region and the energy of the hydrogen ions at the position are obtained, and then based on the obtained concentration and the energy, the hydrogen ion concentration in the channel region is finally obtained. The hydrogen ion concentration in the channel region described in this example means the concentration at the interface between the gate insulating film and the channel region.

Hereinafter, in this example, the hydrogen ion concentration in the channel region of a TFT is evaluated on the basis of the "LSS theory".

In this way, the hydrogen ion concentration in the channel regions 2c and 3c in FIGS. 1 and 2 are regulated in the range of $1\times10^{19}$ ions/cm$^3$ to $1\times10^{20}$ ions/cm$^3$. The TFT of this example is fabricated in the following manner.

Figure 5A:
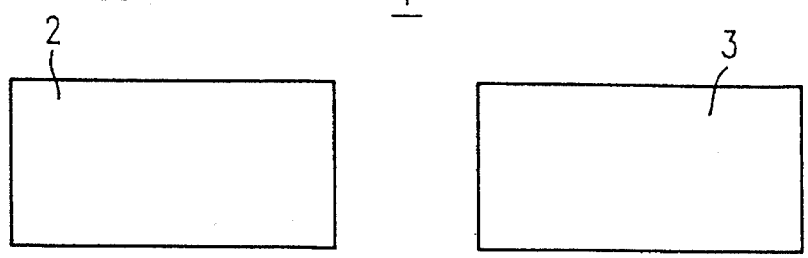
FIGS. 5A through 5C are plan views illustrating the fabrication processes of the TFT shown in FIG. 1.
Figure 5B:
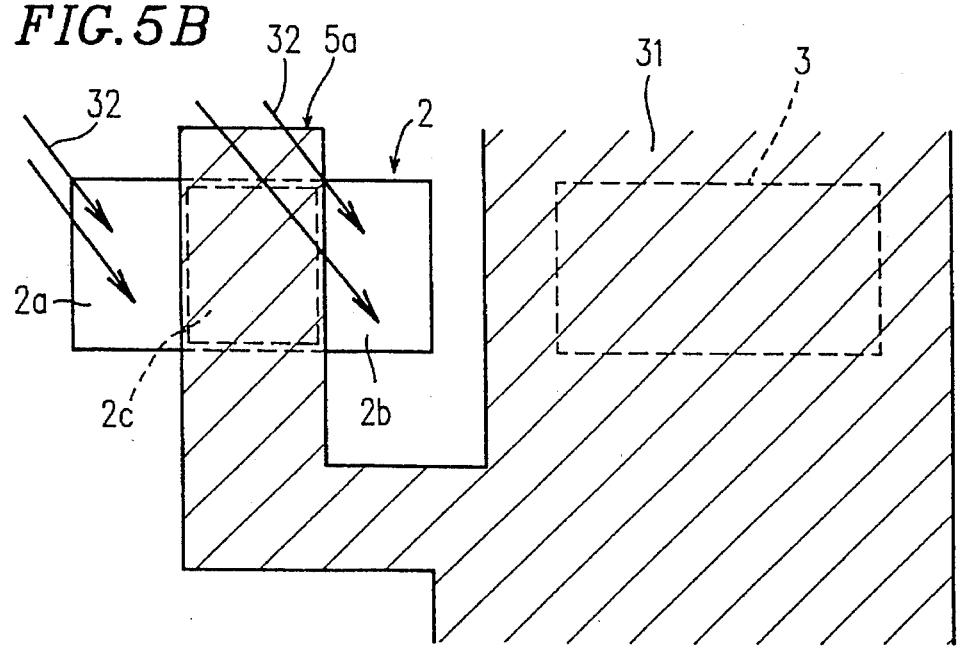
Figure 5C:
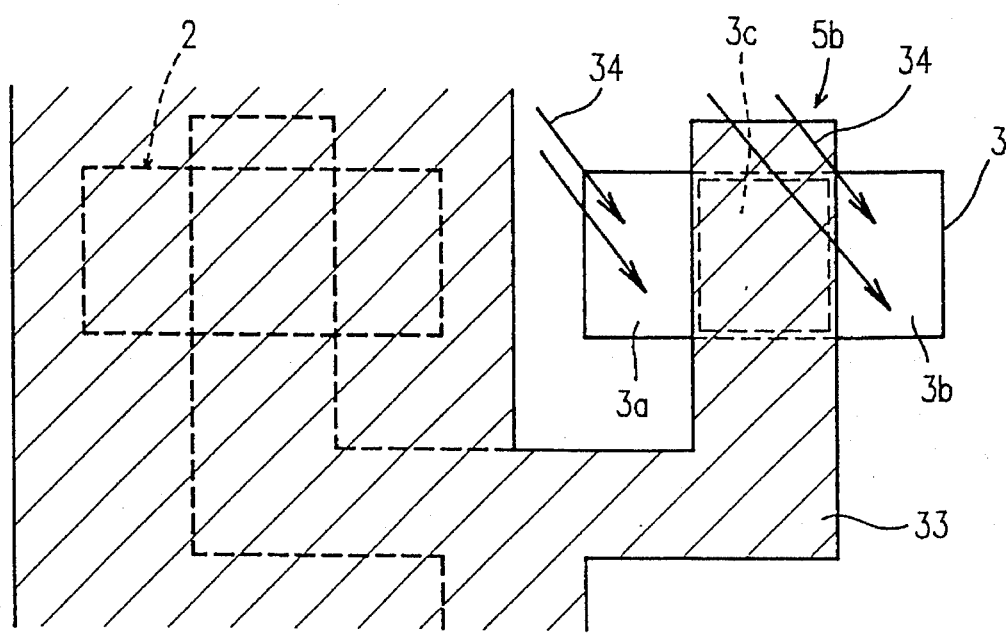

FIGS. 5A to 5C are plan views schematically showing the fabrication process of the TFT shown in FIG. 1.

First, as shown in FIG. 5A, on a surface of a transparent insulating substrate 1 made of glass or the like, semiconductor layers 2 and 3 having a thickness of 100 nm are formed using polycrystalline silicon. The semiconductor layers 2 and 3 are formed so as to have the patterns shown in FIG. 5A. Then, over the entire surface of the substrate 1 so as to cover the semiconductor layers 2 and 3, the gate insulating film 4 of SiO$_2$ is formed so as to have a thickness of 100 nm. Then, on the gate insulating film 4, a metal film for a gate electrode interconnection 5 and gate electrodes 5a and 5b is formed so as to have a thickness in the range of 300 nm to 1 µm.

Conventionally, for the gate bus line, aluminum is used for the purpose of decreasing the resistance. However, for the gate electrodes of the TFT, it is impossible to use aluminum because of the annealing process at a high temperature which is performed after the impurity implantation for forming the source and drain. Aluminum is a metal having a low melting point. Thus, if aluminum is exposed at a temperature of 450° C. or more, there arise various problems such as the roughness of the metal film surface, the occurrence of protrusions, and the peeling-off of the metal film. On the other hand, in the fabrication method of the TFT according to the invention, the above-described self-activation ion shower doping method which does not necessitate the annealing at a high temperature is used for the impurity implantation for forming the source and drain. Therefore, the source and drain are formed at a lower temperature of 450° C. or less. In other words, it is possible to use aluminum or a metal containing aluminum for the gate electrode interconnection 5 and the gate electrodes 5a and 5b. In this example, all of the process steps after the ion implantation are conducted at temperatures of 450° C. or less, and aluminum is used for the gate electrode interconnection 5 (the gate electrodes 5a and 5b). Also, aluminum is used for the gate bus line, and hence the gate electrode interconnection 5 (the gate electrodes 5a and 5b) is formed integrally with the gate bus line. Since the gate electrodes 5a and 5b and the gate bus line are formed in the integral manner, it is unnecessary to form contact holes for connecting the gate portion (the gate electrodes 5a and 5b) of the TFT to the gate bus line. Accordingly, a low-resistance interconnection can easily be formed. Additionally, in this example, aluminum is used for the metal film for the gate electrode interconnection 5 and the gate electrodes 5a and 5b, and alternatively, low-resistance metal materials containing aluminum such as AlSi, a two-layer material of Ti/Al, or a two-layer material of Ti/AlSi can be used.

Next, on the aluminum thin film for forming the gate electrode interconnection 5 and the gate electrodes 5a and 5b, a positive resist film 31 having a pattern shown as a hatched area in FIG. 5B is applied. Then, exposure and development are performed. The resist film 31 is a positive type, and has a resist pattern for covering the non-exposed area, i.e., the surface center portion of the semiconductor layer 2 and the entire surface of the semiconductor layer 3. Then, a portion of the metal film in the exposed area is etched, so as to form the gate electrode 5a.

Then, in the state in which the resist film 31 is not removed, or in the state in which the resist film 31 is removed and another resist film (not shown) for covering the entire surface of the semiconductor layer 3 is formed, a mixed gas 32 is doped in a self-aligned manner by the above-described ion shower doping method of self-activation. The mixed gas 32 is made of an N-type impurity such as P (phosphorus) and a hydrogen ion. As a result, an N-type semiconductor-layer source 2a and an N-type semiconductor-layer drain 2b are formed on the respective side portions of the semiconductor layer 2 which are separated by the resist film 31 and the gate electrode 5a without performing the activation annealing. At the same time, the concentration of hydrogen ions implanted into the channel region 2c is regulated in the range of $1\times10^{19}$ ions/cm$^3$ to $1\times10^{20}$ ions/cm$^3$ by the film thickness of the gate electrode 5a or the film thickness of the resist pattern 31 on the gate electrode 5a for forming the gate electrode 5a.

As described above, by regulating the implantation of excess hydrogen ions into the channel region 2c during the impurity implantation, it is possible to utilize the ion shower doping method in which the source and drain forming process can be performed at temperatures of 600° C. or less without requiring the annealing step, with high reliability.

As the material gas, a mixed gas of a hydrogen gas and a PH$_3$ gas is used, so as to produce a plasma.

In this case, desirably, the resist film 31 for forming the gate electrode 5a is used as a mask for impurity implantation. Thus, it is unnecessary to additionally form a resist pattern for the impurity doping, so that a photolithography process for the formation of the additional resist pattern can be omitted. By appropriately adjusting the film thickness of the resist film 31 and the film thickness of the gate electrode 5a, it is possible to prevent and regulate an excess implantation of hydrogen ions into the channel region 2c and also to prevent the impurity ions into the gate electrode 5a.

By the conventional ion doping method requiring the annealing at a high temperature, the hydrogen atoms implanted together with the impurity ions are released from the semiconductor-layer channel region during the high-temperature annealing. Therefore, usually, after the last step requiring the succeeding high-temperature annealing, a hydrogenation step for compensating for the electric characteristics of the channel region by introducing an appropriate amount of hydrogen ions into the channel region again, and a channel dope step for reducing the threshold voltage of the TFT by intendedly implanting the impurities into the channel region are required. However, according to the fabrication method of the TFT of the invention, as shown in the following examples, the impurity implantation is performed while regulating the concentration of hydrogen ions implanted into the channel region during the formation of the source and drain so as to optimize the electric characteristics of the TFT. Thereafter, all of the process steps are performed at temperatures of 450° C. or less, which does not cause the elimination of hydrogen atoms. Accordingly, it is possible to simplify the fabrication process because a step of hydrogenation and a step of channel dope are not required.

After the above-described ion doping, the resist film 31 for the ion doping, or the additional resist film (not shown) covering the entire surface of the semiconductor layer 3 is removed.

Next, in the same way as described above, as shown in FIG. 5C, a positive resist film is applied on the aluminum thin film. Then, exposure and development are conducted. As a result, a pattern of a resist film 33 is formed so as to cover the surface center portion of the semiconductor layer 3 and the entire surface of the semiconductor layer 2. Then, a portion of the exposed area of the aluminum thin film is etched, so as to form the gate electrode 5b.

In the state in which the resist film 33 is not removed, or in the state in which the resist film 33 is removed and a new additional resist film (not shown) covering the entire surface 2 is formed, a mixed gas 34 made of hydrogen ions and P-type impurity such as B (boron) (e.g., a mixed gas of a hydrogen gas and $B_2H_6$) is doped in a self-aligned manner by the above-described shower doping method of self-activation ion. As a result, a P-type semiconductor-layer source 3a and a P-type semiconductor-layer drain 3b are formed on the respective side portions of the semiconductor layer 3 which are separated by the resist film 33 and the gate electrode 5b without performing the activation annealing. At the same time, the concentration of hydrogen ions implanted into the channel region 3c is regulated in the range of $1\times10^{19}$ ions/cm$^3$ to $1\times10^{20}$ ions/cm$^3$ by the film thickness of the gate electrode 5b or the film thickness of the resist film 33 on the gate electrode 5b for forming the gate electrode 5b.

Also in this case, desirably, the ion doping is performed in the state in which the resist film 33 is not removed. Thus, the above-described advantages can be attained.

After the ion doping, the resist film 33 for the ion doping, or the additional resist film (not shown) covering the entire surface of the semiconductor layer 2 is removed.

Next, on the surface of the substrate 1 having the gate electrode interconnection 5 and the gate electrodes 5a and 5b formed thereon, an interlayer insulating film (not shown) having a thickness of 500 nm is formed at 430° C. by APCVD (Atmospheric Pressure Chemical Vapor Deposition). More preferably, the interlayer insulating film having a thickness of 500 nm is formed at 300° C. by plasma TEOSCVD (Tetra Ethoxy Silan CVD). In this example, as the interlayer insulating film, a silicon oxide ($SiO_2$) film is used.

Then, at positions corresponding to the N-type semiconductor-layer source 2a and the N-type semiconductor-layer drain 2b of the semiconductor layer 2, contact holes 6a and 6b are formed through the interlayer insulating film. The contact holes 6a and 6b reach the surface of the semiconductor layer 2. Also, at positions corresponding to the P-type semiconductor-layer source 3a and the P-type semiconductor-layer drain 3b of the semiconductor layer 3, contact holes 7a and 7b are formed through the inter-layer insulating film. The contact holes 7a and 7b reach the surface of the semiconductor layer 3.

Finally, so as to fill the contact holes 6a, b, 7a, and 7b, a metal film which is made of the same material as that of the gate portion (in this example, made of aluminum) is formed on the surface of the interlayer insulating film. The metal film is patterned into a source electrode and a source interconnection (not shown). Through the above-described process steps, the TFT having the CMOS structure as shown in FIG. 1 is completed by the TFT fabrication method according to this example.

The process steps after the ion implantation step as described above are all performed at temperatures of 450° C. or less.

Accordingly, the objective of this invention is to eliminate the problems in that excess hydrogen is introduced into the channel region during the fabrication of TFT by the conventional ion shower doping method of self-activation, so that the transistor characteristics of the fabricated TFT are deteriorated by the excess hydrogen ions. As to the hydrogen ion concentration in the channel region, if the hydrogen ion concentration is set in the range of $1\times10^{19}$ ions/cm$^3$ to $1\times10^{20}$ ions/cm$^3$, the transistor characteristics of the TFT are not deteriorated. This is specifically described below together with the method for regulating the hydrogen ion concentration, by way of Experiments 1 and 2 using the TFT fabricated by the above-described TFT fabrication method.

Experiment 1

The transistor characteristics of the N-channel TFT are explained below in the case where the TFTs having the CMOS structure shown in FIG. 1 are fabricated by the above-described TFT fabrication method in which only the Al gate electrode on the semiconductor layer is used as the mask for regulating the hydrogen ion concentration of the channel region.

Figure 6:
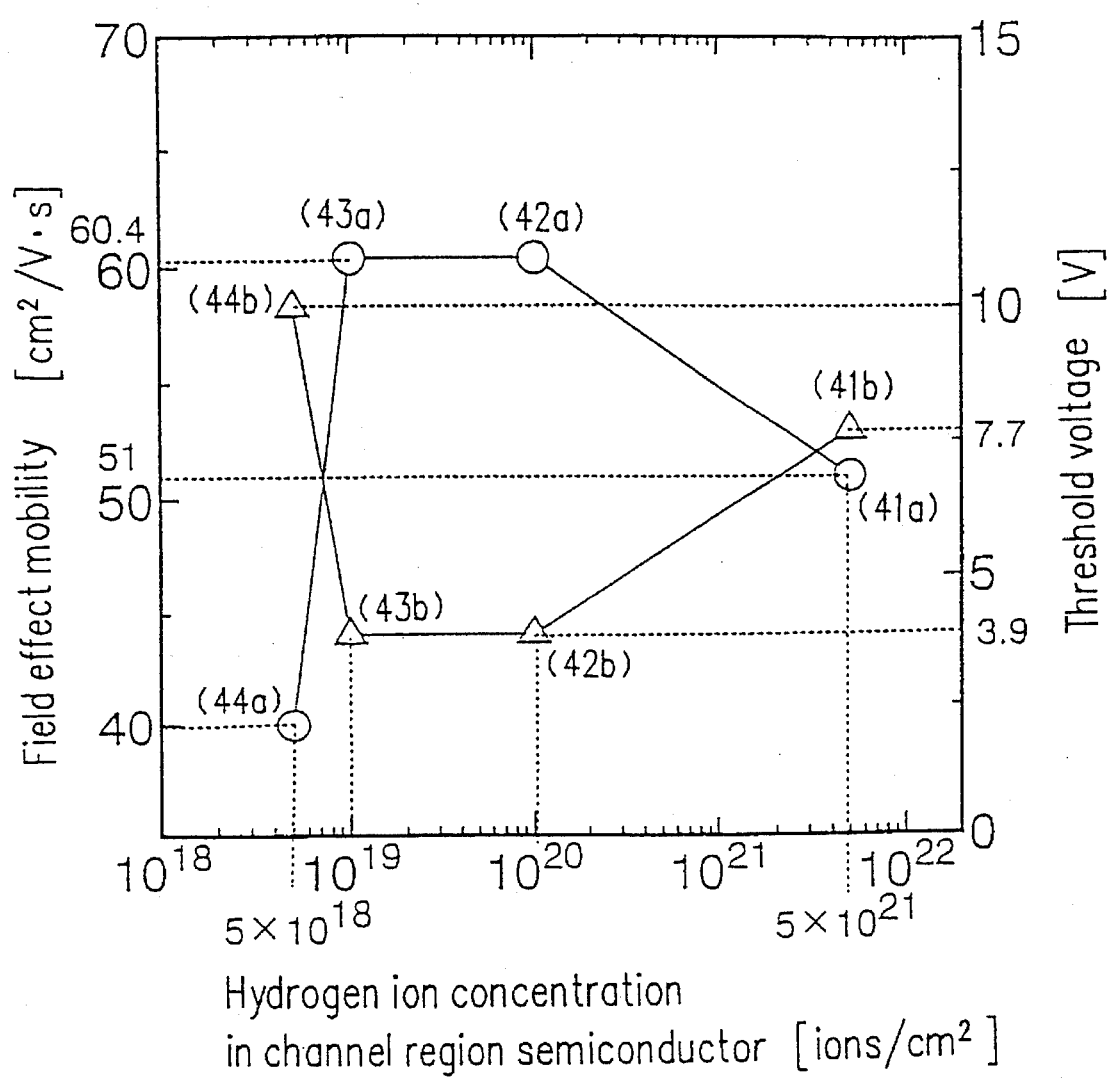
FIG. 6 is a diagram showing a relationship between a hydrogen ion concentration of the TFT channel region and the TFT characteristics (a value of threshold voltage and field effect mobility).
Figure 7:
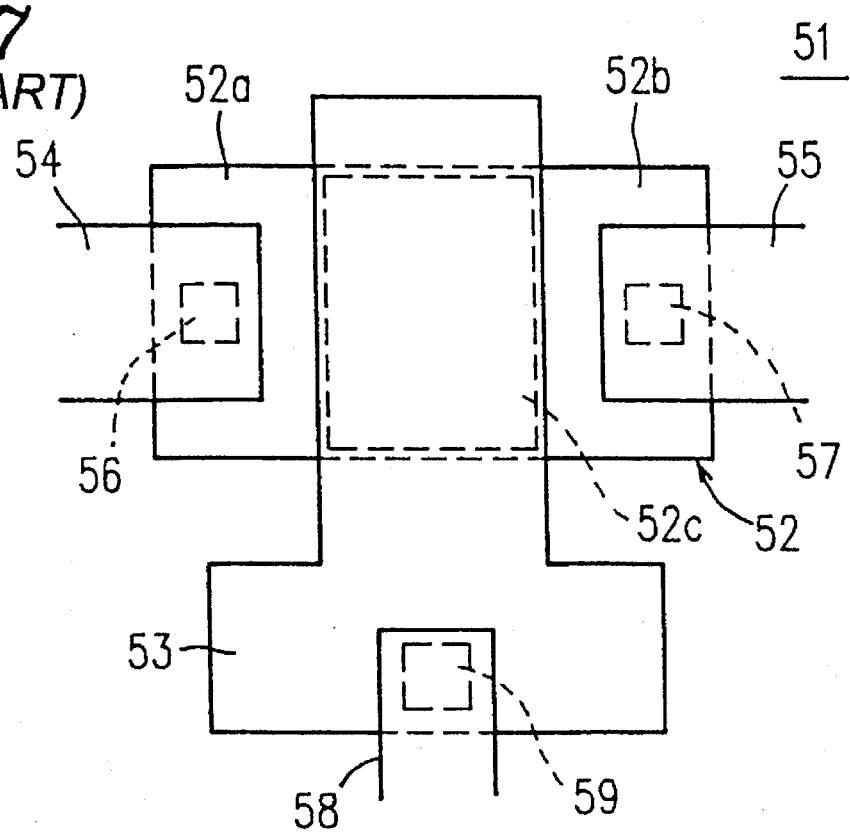
FIG. 7 is a plan view of a conventional TFT having a staggered structure.
Figure 8A:
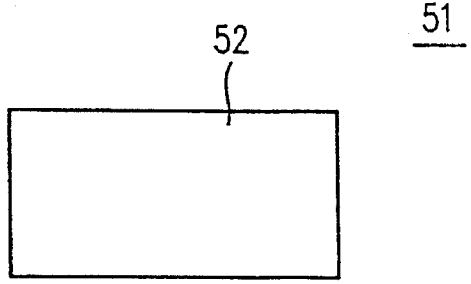
FIGS. 8A through 8C are plan views illustrating the fabrication processes of the TFT shown in FIG. 7.
Figure 8B:
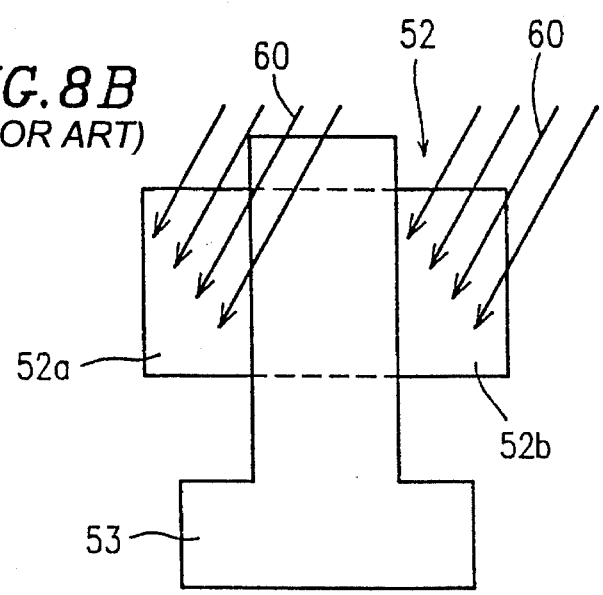
Figure 8C:
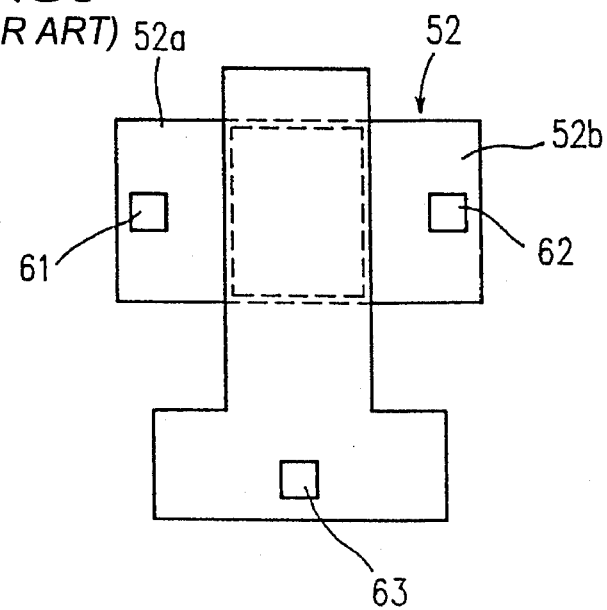

FIG. 6 shows the relationship between the hydropen ion concentration of the channel regions 2c and 3c and the transistor characteristics of the TFT. FIG. 6 is plotted by indicating the hydrogen ion concentration of the channel region as the horizontal axis, and by indicating the threshold voltage (indicated by Δ in the figure) and the field effect mobility (indicated by ○ in the figure) as the transistor characteristics of the N-channel TFT as the vertical axis.

A TFT which is used for comparison was fabricated by the above-described TFT fabricating method. The ion shower doping conditions for forming the source and drain of the N-channel TFT at this time were commonly set as follows by using a $PH_3$ gas which is diluted by a hydrogen gas as a material gas.

Acceleration voltage 100 KV

Total dose $2\times10^{16}$ ions/cm$^2$

The hydrogen ion concentration was regulated by the mask on the channel region during the implantation. The hydrogen ion concentration of the channel region was obtained by using Equation (1) of the "LSS theory".

As shown in FIG. 6, when the hydrogen ion concentration of the channel region was $5\times10^{21}$ ions/cm$^3$, the threshold voltage was 7.7 V (point 41b) and the field effect mobility was 51.5 [cm$^2$/V·s] (point 41a) for the transistor characteristics of the N-channel TFT. An S coefficient, which indicates the activation speed of the transistor, is about 2.0 in this case. The S coefficient is a value indicative of a gate voltage required for increasing the current from the drain region of the transistor by one digit. As the S coefficient becomes smaller, a voltage required for varying the current from the drain region can be lower and the resulting transistor has a higher switching speed. In this experiment, the film thickness of the Al gate electrode on the channel region was set to be 300 nm for regulating the amount of hydrogen.

As shown in FIG. 6, when the hydrogen ion concentration of the channel region was $5\times10^{18}$ ions/cm$^3$, the threshold voltage was 10 V (point 44b) and the field effect mobility was 40 [cm$^2$/V·s] (point 44a) for the transistor characteristics of the TFT. At this time, the film thickness of the Al gate electrode on the channel region was set to be 500 nm. Then, ion doping is performed while the resist film (thickness: 1.1 μm) for forming the Al electrode remains on the Al gate electrode, so as to regulate the amount of hydrogen.

On the contrary, by regulating the hydrogen ion concentration in the channel region in the range of $1\times10^{19}$ ions/cm$^3$ to $1\times10^{20}$ ions/cm$^3$ as shown in FIG. 6, the lowering of threshold voltage and the increase of field effect mobility were observed and the best transistor characteristics of the TFT could be obtained.

In Experiment 1, the film thickness of the Al gate electrode was set to be 1 μm. The Al gate electrode was used as the implantation mask, so as to regulate the hydrogen ion concentration of the channel region to be $1\times10^{20}$ ions/cm$^3$. As to the transistor characteristics of the TFT in this experiment, the threshold voltage was 3.9 V (point 42b) and the field effect mobility was 60.4 [cm$^2$/V·s] (point 42a) as shown in FIG. 6. In other words, good transistor characteristics were attained.

The above-described phenomenon and effects can also be obtained for the P-channel TFT in the CMOS structure as shown in FIG. 1.

Experiment 2

The transistor characteristics of the N-channel TFT are explained below in the case where the TFTs having the CMOS structure shown in FIG. 1 are fabricated by the above-described TFT fabrication method in which the Al gate electrode on the semiconductor layer and the resist film for forming the electrode are used as the mask for regulating the hydrogen ion concentration of the channel region. The ion shower doping conditions for forming the source and drain on the N-channel side at this time were commonly set as follows by using a $PH_3$ gas which is diluted by a hydrogen gas as a material gas.

Acceleration voltage 100 KV

Total dose $2 \times 10^{16}$ ions/cm$^2$

The hydrogen ion concentration of the channel region was obtained by using Equation (1) of the "LSS theory" described above.

In the TFT fabrication method, the film thickness of the resist film for impurity ion implantation was set to be 1.1 µm and the film thickness of the Al gate electrode was set to be 300 nm. Thus, the hydrogen ion concentration of the channel region was regulate to be $1 \times 10^{19}$ ions/cm$^3$. As to the transistor characteristics of the N-channel TFT in this experiment, the threshold voltage was 3.9 V (point 43b) and the field effect mobility was 60.4 [cm$^2$/V·s] (point 43a) as shown in FIG. 6. The S coefficient was a value of about 1.2 which is smaller than the value of 2.0 in the case of the hydrogen ion concentration of $5 \times 10^{20}$ ions/cm$^3$. In other words, good transistor characteristics were attained.

The above-described phenomenon and effects can also be obtained for the P-channel TFT in the CMOS structure as shown in FIG. 1.

In the above examples, it is preferred that the total ion current density including hydrogen ions is 1 µA/cm$^2$ or more in order to enhance the effect for activating the impurity ions without performing the annealing step.

The above-described phenomenon and effects can also be obtained for the case where a $B_2H_6$ gas is alternatively used as the material gas.

In the above-explained examples and experiments, the TFT has a top gate structure in which the semiconductor layer, the gate insulating film and the gate electrode are successively formed from the bottom. Alternatively, the TFT may have a bottom gate structure in which the forming order is reversed. In the case of the TFT having the bottom gate structure, the ion implantation is performed from the transparent substrate side, and the hydrogen ion concentration is regulated in the range of $1 \times 10^{19}$ ions/cm$^3$ to $1 \times 10^{20}$ ions/cm$^3$ by the film thickness of the gate electrode and the like. Alternatively, the ion implantation may be performed from the semiconductor side to the channel region of the semiconductor layer on the gate electrode with the hydrogen ion concentration in the range of $1 \times 10^{19}$ ions/cm$^3$ to $1 \times 10^{20}$ ions/cm$^3$.

In this invention, the gate electrode can be made of a material selected from a group including aluminum, a metal containing aluminum, and a layered structure of aluminum and a metal other than aluminum. Alternatively, the gate electrode can be made of a material from a heavy metal such as Pt and Au or a silicide such as tungsten silicide and titanium silicide. In such a case, the wiring resistance of the gate electrode is lowered and also a high stop ability against the ion shower doping can be attained by a thin film thickness.

As described above, in the method of fabricating the TFT according to the invention, the hydrogen ion concentration in the channel region corresponding to the position of the gate electrode of the TFT is regulated in the range of $1 \times 10^{19}$ ions/cm$^3$ to $1 \times 10^{20}$ ions/cm$^3$. Thus, the damage of the channel region by the hydrogen ions can be suppressed and the hydrogenation of the channel region can be performed. In this way, TFTs having good transistor characteristics can be obtained while taking advantage of the ion shower doping method which does not necessitate the annealing step. Since the ion doping can be performed at temperatures of 450° C. or less, the gate electrode and the gate bus line made of aluminum or a low-resistance metal containing aluminum can be formed as an integral part in one process step. Accordingly, it becomes unnecessary to provide contact holes for connecting the gate bus line to the gate electrodes. Thus, a low-resistance interconnection can be easily formed, and the production yield can be improved.

In addition, the resist pattern used for forming the gate electrode is used as a mask for impurity implantation, so that the gate electrode can be protected from impurities and hydrogen.

Furthermore, a new resist pattern for impurity implantation is not required to be formed, so that the fabrication process can be simplified.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a thin film transistor comprising the steps of:

forming a semiconductor layer and a gate electrode on an insulating substrate with a gate insulating film interposed between the layer and the electrode; and implanting an impurity element into a surface of the semiconductor layer by accelerating hydrogen ions and ions of an element of one of the group III and the group V of the periodic table using at least one of the gate electrode and a resist mask used for forming the gate electrode as a mask, so as to perform both formation of source and drain regions and hydrogenation of a channel region, wherein the concentration of hydrogen ions in the channel region of the semiconductor layer is regulated in the range of $1 \times 10^{19}$ ions/cm$^3$ to $1 \times 10^{20}$ ions/cm$^3$.

2. A method for fabricating a thin film transistor according to claim 1, wherein the semiconductor layer is made of polycrystalline silicon.

3. A method for fabricating a thin film transistor according to claim 1, wherein the gate electrode is formed of a material selected from a group at least including aluminum, a metal containing aluminum, and a layered structure of aluminum and a metal other than aluminum.

4. A method for fabricating a thin film transistor according to claim 1, wherein steps of forming an insulating film, forming contact holes, depositing a metalization layer which are performed after the step of implanting the impurity element are performed at temperatures of 450° C. or less.

5. A method for fabricating a thin film transistor comprising the steps of:

forming a semiconductor layer on an insulating substrate;

forming a gate insulating film on the semiconductor layer;

forming a gate electrode on the gate insulating film; and implanting an impurity element into the semiconductor layer by accelerating hydrogen ions and ions of an element of one of the group III and the group V of the periodic table using the gate electrode as a mask, so as to perform both formation of source and drain regions and hydrogenation of a channel region, wherein the concentration of hydrogen ions in the channel region is regulated in the range of $1\times10^{19}$ ions/cm$^3$ to $1\times10^{20}$ ions/cm$^3$.

6. A method for fabricating a thin film transistor according to claim 5, wherein the semiconductor layer is made of polycrystalline silicon.

7. A method for fabricating a thin film transistor according to claim 5, wherein the gate electrode is formed of a material selected from a group at least including aluminum, a metal containing aluminum, and a layered structure of aluminum and a metal other than aluminum.

8. A method for fabricating a thin film transistor according to claim 5, wherein steps of forming an insulating film, forming contact holes, and depositing a metalization layer which are performed after the step of implanting the impurity element are performed at temperatures of 450° C. or less.

9. A method for fabricating a thin film transistor comprising the steps of:

forming a semiconductor layer on an insulating substrate;

forming a gate insulating film on the semiconductor layer;

forming a conductive thin film on the gate insulating film;

forming a resist pattern having a predetermined pattern on the conductive thin film;

forming a gate electrode and a gate electrode interconnection from the conductive thin film using the resist pattern as a mask; and implanting an impurity element into the semiconductor layer by accelerating hydrogen ions and ions of an element of one of the group III and the group V of the periodic table using the resist pattern and the gate electrode as a mask, so as to perform both formation of source and drain regions and hydrogenation of a channel region, wherein the concentration of hydrogen ions in the channel region is regulated in the range of $1\times10^{19}$ ions/cm$^3$ to $1\times10^{20}$ ions/cm$^3$.

10. A method for fabricating a thin film transistor according to claim 9, wherein the semiconductor layer is made of polycrystalline silicon.

11. A method for fabricating a thin film transistor according to claim 9, wherein the gate electrode is formed of a material selected from a group at least including aluminum, a metal containing aluminum, and a layered structure of aluminum and a metal other than aluminum.

12. A method for fabricating a thin film transistor according to claim 9, wherein steps of forming an insulating film, forming contact holes, and depositing a metalization layer which are performed after the step of implanting the impurity element are performed at temperatures of 450° C. or less.

* * * * *